US010962585B2

United States Patent
Pronin et al.

(10) Patent No.: US 10,962,585 B2
(45) Date of Patent: Mar. 30, 2021

(54) GATE CHARGE MEASUREMENTS USING TWO SOURCE MEASURE UNITS

(71) Applicant: Keithley Instruments, LLC, Solon, OH (US)

(72) Inventors: Alexander N. Pronin, Twinsburg, OH (US); Mary Anne Tupta, Twinsburg, OH (US)

(73) Assignee: Keithley Instruments, LLC, Solon, OH (US)

( * ) Notice: Subject to any disclaimer, the term of this patent is extended or adjusted under 35 U.S.C. 154(b) by 145 days.

(21) Appl. No.: 16/403,387

(22) Filed: May 3, 2019

(65) Prior Publication Data
US 2019/0346501 A1  Nov. 14, 2019

Related U.S. Application Data

(60) Provisional application No. 62/669,252, filed on May 9, 2018.

(51) Int. Cl.
*G01R 31/26* (2020.01)
*G01R 31/14* (2006.01)

(52) U.S. Cl.
CPC ......... *G01R 31/2621* (2013.01); *G01R 31/14* (2013.01); *G01R 31/2601* (2013.01); *G01R 31/2607* (2013.01); *G01R 31/26* (2013.01)

(58) Field of Classification Search
CPC ........ G01R 31/00; G01R 31/12; G01R 31/14; G01R 31/26; G01R 31/2601; G01R 31/2607; G01R 31/2621

USPC ............... 324/500, 512, 522, 523, 527, 537, 324/762.01, 762.09, 600, 649, 713; 257/E21.521, 48; 702/1, 57, 64

See application file for complete search history.

(56) References Cited

U.S. PATENT DOCUMENTS

| 5,629,542 | A | * | 5/1997 | Sakamoto | ........... H01L 27/0629 257/328 |
| 6,324,042 | B1 | * | 11/2001 | Andrews | ................. G01R 31/00 361/93.2 |
| 6,489,829 | B1 | * | 12/2002 | Yu | ......................... H03K 17/163 327/112 |

(Continued)

FOREIGN PATENT DOCUMENTS

JP  2015-161627  *  9/2015  ......... G01R 31/2621

*Primary Examiner* — Hoai-An D. Nguyen
(74) *Attorney, Agent, or Firm* — Miller Nash Graham & Dunn; Andrew J. Harrington

(57) ABSTRACT

A testing environment includes a first measuring unit connected to a gate of a MOSFET device and a second measuring unit connected to a drain of the MOSFET device. The testing environment is particularly useful for testing gate charge for MOSFET devices. In a first phase, the gate of the device is driven with electrical current while the drain is driven with a constant voltage. As the MOSFET device turns on, the second measuring unit switches from providing the constant voltage to providing a constant current to the drain of the MOSFET, while measuring the drain voltage. The switching of modes is automatic and occurs without user intervention. After the MOSFET device has been driven to VgsMax by the gate current, all of the relevant data is stored, which may be analyzed and presented to a user in a User Interface or presented in other manner.

19 Claims, 7 Drawing Sheets

(56) References Cited

U.S. PATENT DOCUMENTS

| | | | | |
|---|---|---|---|---|
| 6,756,806 B1* | 6/2004 | Yang | ............... | G01R 31/2621 |
| | | | | 324/762.09 |
| 7,595,649 B2* | 9/2009 | Chatterjee | .......... | G01R 31/2621 |
| | | | | 324/719 |
| 8,582,378 B1* | 11/2013 | Chuang | ............ | G11C 29/50004 |
| | | | | 365/201 |
| 10,132,696 B2* | 11/2018 | Kiep | ....................... | G01K 7/01 |
| 2007/0004054 A1* | 1/2007 | Orr | ........................ | H01L 23/34 |
| | | | | 438/10 |
| 2007/0182435 A1* | 8/2007 | Lui | .................... | G01R 31/2621 |
| | | | | 324/762.09 |
| 2012/0169415 A1* | 7/2012 | Na | .................... | G01R 31/2621 |
| | | | | 327/564 |
| 2015/0160285 A1* | 6/2015 | Joh | .................... | G01R 31/2621 |
| | | | | 324/754.03 |

\* cited by examiner

GATE CHARGE MEASUREMENTS USING TWO SOURCE MEASURE UNITS

CROSS REFERENCE TO RELATED APPLICATIONS

This application is a non-provisional of and claims benefit from U.S. Provisional Patent Application 62/669,252, filed May 9, 2018, entitled GATE CHARGE MEASUREMENTS USING TWO SOURCE MEASUREMENT UNITS, the contents of which are hereby incorporated by reference herein.

TECHNICAL FIELD

This disclosure is directed to systems and methods related to test and measurement systems, and in particular, to a test and measurement instrument system for measuring properties, such as gate charge, of a transistor.

BACKGROUND

Power MOSFETs (Metal Oxide Semiconductor Field-Effect Transistors) are special types of MOSFETs capable of operating at higher or much higher power levels compared to standard MOSFETs. Power MOSFETs are used in a variety of applications, including high-speed switching devices. The switching speed of the device is largely affected by internal capacitances, which are often specified in data sheets for particular devices as an input capacitance (Ciss), output capacitance (Coss), and reverse transfer capacitance (Crss). The input and output capacitances are generally derived from the gate-source capacitance (Cgs) and gate-drain capacitance (Cgd). In addition to the various capacitances, the gate charge between the gate and source (Qgs) and between the gate and drain (Qgd), may also be used to assess the switching performance of the MOSFET.

The main component of power loss when operating a Power MOSFET is largely due to switching. Such losses are directly related to gate charge (Qg) and parasitic capacitance. It is important to circuit designers, therefore, that gate charge (Qg) and other parameters of Power MOSFETs can be accurately measured Although important, accurately measuring Power MOSFET parameters is difficult to accomplish. For example, the JESD24-2 ("Gate Charge Test Method") standard of the JEDEC (Joint Electron Device Engineering Council) specifies testing gate charge (Qg) of a Power Transistor includes using a pulsed current generator, voltage monitor, and a resistive load to make the gate charge measurement. Testing parameters of devices according to this standard is complicated to set up and may result in errors.

Embodiments of the invention address these and other limitations in the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a test and measurement system that allows a user to make common power device tests using a pair of source measure units (SMUs). The tests may include measuring a gate charge of a transistor, for example. Embodiments herein follow the JEDEC standard for measuring a gate charge, but are implemented with new techniques. The JEDEC standards JESD24-x for measuring gate charge are incorporated by reference herein.

Figure 1:
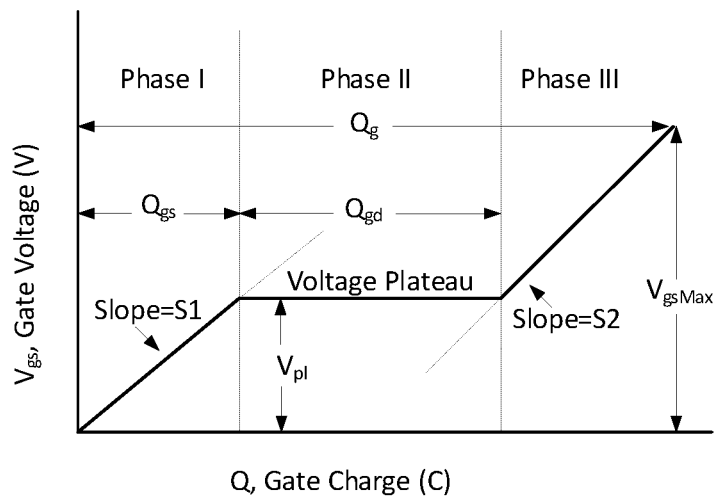
FIG. 1 is graph illustrating a typical gate voltage versus gate charge waveform of a power MOSFET as well as phases of operation.

In embodiments disclosed herein, a fixed test current ($I_g$) is forced into a gate of a MOS transistor and a measured gate source voltage ($V_{gs}$) is plotted against the charge flowing into the gate. A fixed voltage bias is applied to a drain terminal of the MOS transistor. Then, after the transistor turns on, a fixed current flows to the drain terminal of the MOS transistor and the falling drain voltage is measured. All measurements are made with reference to an accurate clock, so that the measured values may be accurately plotted. FIG. 1 shows a typical gate voltage vs. gate charge of a power MOSFET during three phases of operation, Phase I, Phase II, and Phase III, as described in detail below.

The gate charge (Q) is derived from the forced gate current and the time the current is applied, ($I_g$dt). The gate-source charge ($Q_{gs}$) is the charge required, as shown in Phase I of FIG. 1, to reach the beginning of a plateau region where the voltage ($V_{gs}$) is almost constant. The plateau, or Miller voltage ($V_{pl}$) is defined, according to the JEDEC standard, as the gate-source voltage when $dV_{gs}/dt$ is at a minimum. The voltage plateau, i.e., Phase II, is the region when the MOS transistor is switching from the OFF state to the ON state. The gate charge required to complete this switching, that is the charge needed to switch the device from the beginning of Phase II to the end of Phase II, is defined as gate-drain charge ($Q_{gd}$) and is known as the Miller charge. Phase III is the phase of operation where the MOS transistor is ON and the gate voltage rises from the Miller voltage to the maximum gate voltage ($V_{gs}$Max). The total gate charge ($Q_g$) is the charge from the origin to the point where the gate-source voltage ($V_{gs}$) is equal to a specified maximum ($V_{gsMax}$), i.e., the total charge forced to the gate through all three phases Phase I, Phase II, and Phase III.

S1 describes the slope of the $V_{gs}$ line segment during Phase I. S2 is the slope of the $V_{gs}$ line segment during Phase III. The slopes S1 and S2 are used to calculate $Q_{gs}$ and $Q_{gd}$, as specified in the JESD24-2 standard.

Figure 2:
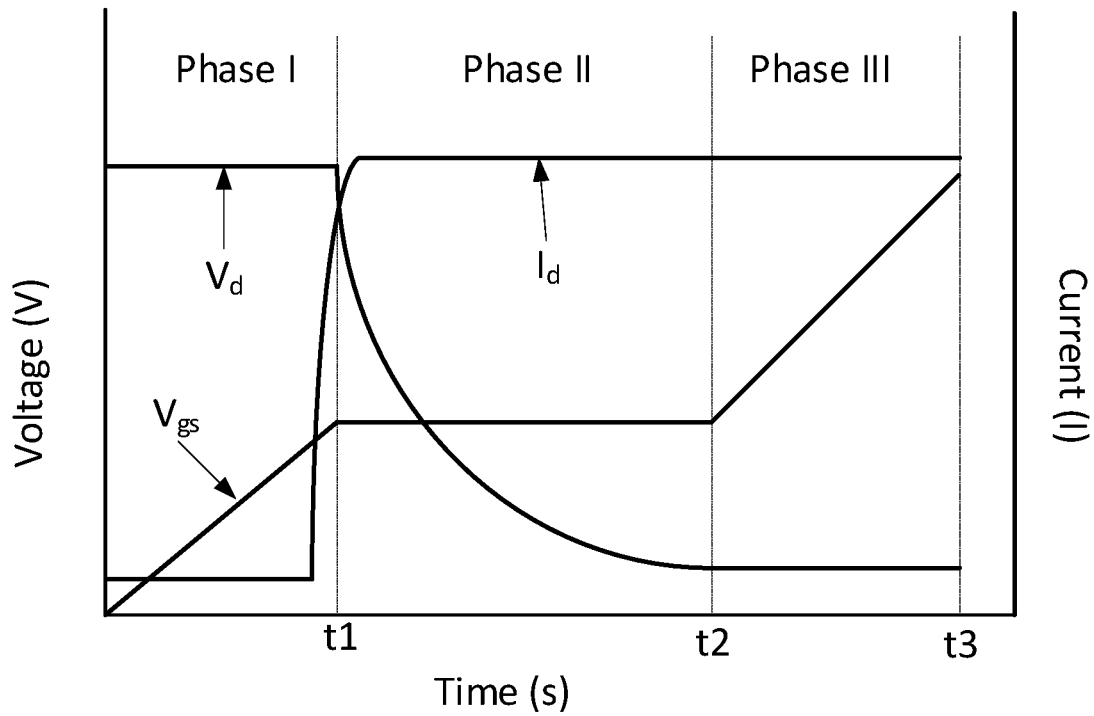
FIG. 2 is graph illustrating a typical gate-source voltage, drain voltage, and drain current vs. time waveforms of a power MOSFET according to embodiments of the disclosure.

FIG. 2 illustrates typical gate and drain waveforms applied to and/or measured from the connected device as a function of time. As electrical current is forced to the gate of the connected MOS device in Phase I, $V_{gs}$ increases until it reaches the threshold voltage. At this point, at the end of Phase I, the drain current ($I_d$) begins to flow. When $C_{gs}$ is charged at time t1, $I_d$ stays constant and the drain voltage ($V_d$) decreases during Phase II. $V_{gs}$ remains constant until it reaches the end of the plateau at the end of Phase II. Once $C_{gd}$ is charged at time t2, the gate-source voltage ($V_{gs}$) starts to increase again in Phase III until it reaches the specified maximum gate voltage ($V_{gsMax}$).

According to embodiments of the invention, two SMUs (Source Measure Units) are used to supply gate current and provide power to the drain of the device.

Figure 3:
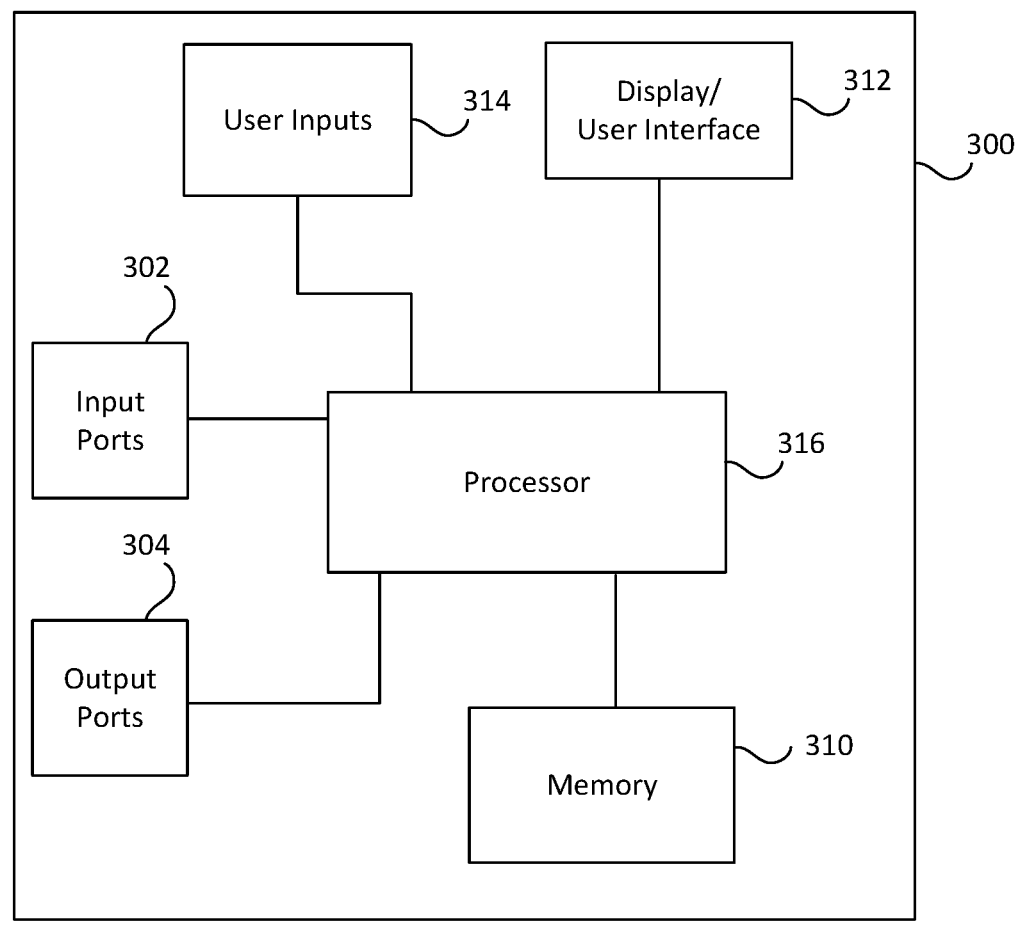
FIG. 3 is a schematic block diagram of an example test and measurement device used to implement embodiments of the disclosure.

FIG. 3 is a block diagram of an example test and measurement instrument 300, such as a SMU, for implementing embodiments of the disclosure as disclosed herein. The test and measurement instrument 300 includes one or more input ports 302 and one or more output ports 304 which may be any electrical signaling medium. Ports 302, 304 may include receivers, transmitters, and/or transceivers. Input ports 302 are used to receive signals from an attached device, such as a DUT (Device Under Test), a MOSFET, Power MOSFET, or other object being tested. Output ports 304 are used to carry generated signals out of the instrument 300 to be applied to a device or a DUT. Examples of output signals include waveforms as well as constant currents and voltages, and may be applied to the device or devices being tested. Each input port 302 is a channel of the test and measurement instrument 300. The input ports 302 are coupled with one or more processors 316 to process the signals and/or waveforms received at the ports 302 from one or more devices under test. Output ports 304 may be coupled to the processor 316, or other components within the instrument 300 that generate the appropriate output signals. Although only one processor 316 is shown in FIG. 3 for ease of illustration, as will be understood by one skilled in the art, multiple processors 316 of varying types may be used in combination, rather than a single processor 316.

The input ports 302 can also be connected to a measurement unit within the test instrument 300, which is not depicted for ease of illustration. Such a measurement unit can include any component capable of measuring aspects (e.g., voltage, amperage, amplitude, etc.) of a signal received via the input ports 302. The output ports 304 can also be connected to various components of the instrument 300, such as voltage sources, current sources, or waveform generators, which are not depicted for ease of illustration. The test and measurement instrument 300 may include additional hardware and/or processors, such as conditioning circuits, an analog to digital converter, and/or other circuitry to convert a received signal to a waveform for further analysis. The resulting waveform can then be stored in a memory 310, as well as displayed on a display 312.

The one or more processors 316 may be configured to execute instructions from memory 310 and may perform any methods and/or associated steps indicated by such instructions, such as displaying values measured to a coupled device according embodiments of the disclosure. Memory 310 may be implemented as processor cache, random access memory (RAM), read only memory (ROM), solid state memory, hard disk drive(s), or any other memory type. Memory 310 acts as a medium for storing data, computer program products, and other instructions.

User inputs 314 are coupled to the processor 316. User inputs 314 may include a keyboard, mouse, trackball, touch-screen, and/or any other controls employable by a user to with a User Interface on the display 312. The display 312 may be a digital screen, a cathode ray tube based display, or any other monitor to display waveforms, measurements, and other data to a user. While the components of test instrument 300 are depicted as being integrated within test and measurement instrument 300, it will be appreciated by a person of ordinary skill in the art that any of these components can be external to test instrument 300 and can be coupled to test instrument 300 in any conventional manner (e.g., wired and/or wireless communication media and/or mechanisms). For example, in some embodiments, the display 312 may be remote from the test and measurement instrument 300.

Figure 4:
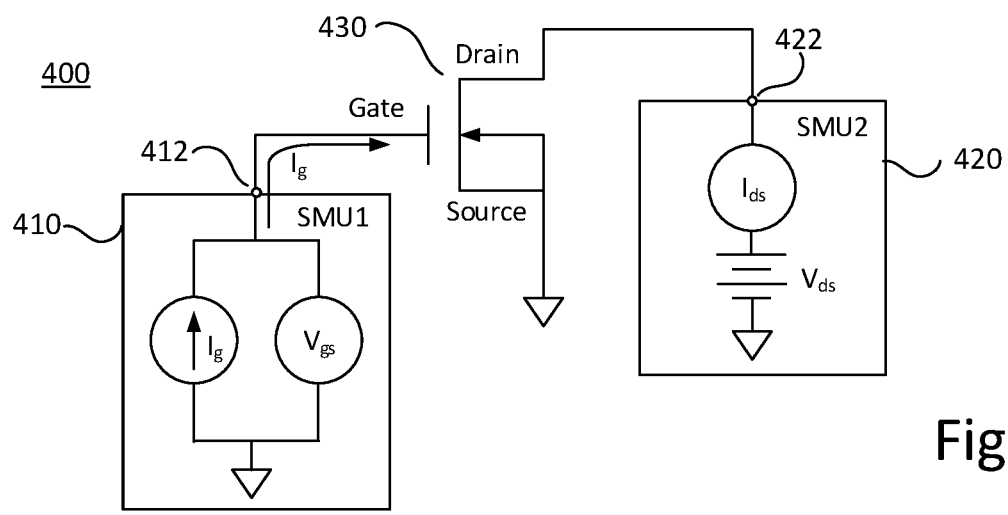
FIG. 4 is a schematic block diagram of an example test and measurement system for measuring parameters of a power MOSFET according to embodiments of the disclosure.

FIG. 4 illustrates an example test and measurement system for measuring the gate charge using two SMUs. The test and measurement system includes two SMUs, 410, 420, which may be an embodiment of the test and measurement device 300 illustrated in FIG. 3. The SMUs 410, 420 may be embedded within another device, such as a S530/S540 Parametric Tester or 4200A-SCS System, by Keithley Instruments, for example. In some embodiments, the two SMUs 410, 420 may be connected to a processor or any other type of computing device.

FIG. 4 illustrates the basic circuit diagram and connections for performing the gate charge test. The force HI terminal 412 of SMU 410 is connected to a gate terminal of a MOSFET 430, and forces the gate current ($I_g$) as well as measures the gate-source voltage ($V_{gs}$) as a function of time. The second SMU 420 is connected to the drain of the MOSFET 430 through the Force HI terminal 422, and applies a fixed voltage (Vas) to the drain at a specified current compliance ($I_{ds}$).

During the gate charge test, at approximately the end of PHASE 1 described in FIG. 2, the gate voltage increases and turns ON the MOSFET transistor 430. During the transition in the plateau region, Phase II, the drain SMU 420 switches from a voltage control mode to a current control mode, because the measured drain current exceeds the specified compliance level. The SMU 420 is programmed to make this switch automatically, i.e., without operator intervention, based on the drain current ($I_d$) rising quickly as the MOSFET 430 turns on. As seen in FIG. 2, after switching from voltage control mode to current control mode, the SMU 420 drives a steady current to the drain of the MOSFET 430. In addition to driving the drain current while in the current control mode, the SMU 420 also measures the voltage of the drain ($V_d$) as the MOSFET transitions from the OFF state to the ON state. The software controlling SMU 420 returns the measured drain current transients and measured drain voltage during the transition from the OFF state to the ON state.

Figure 5:
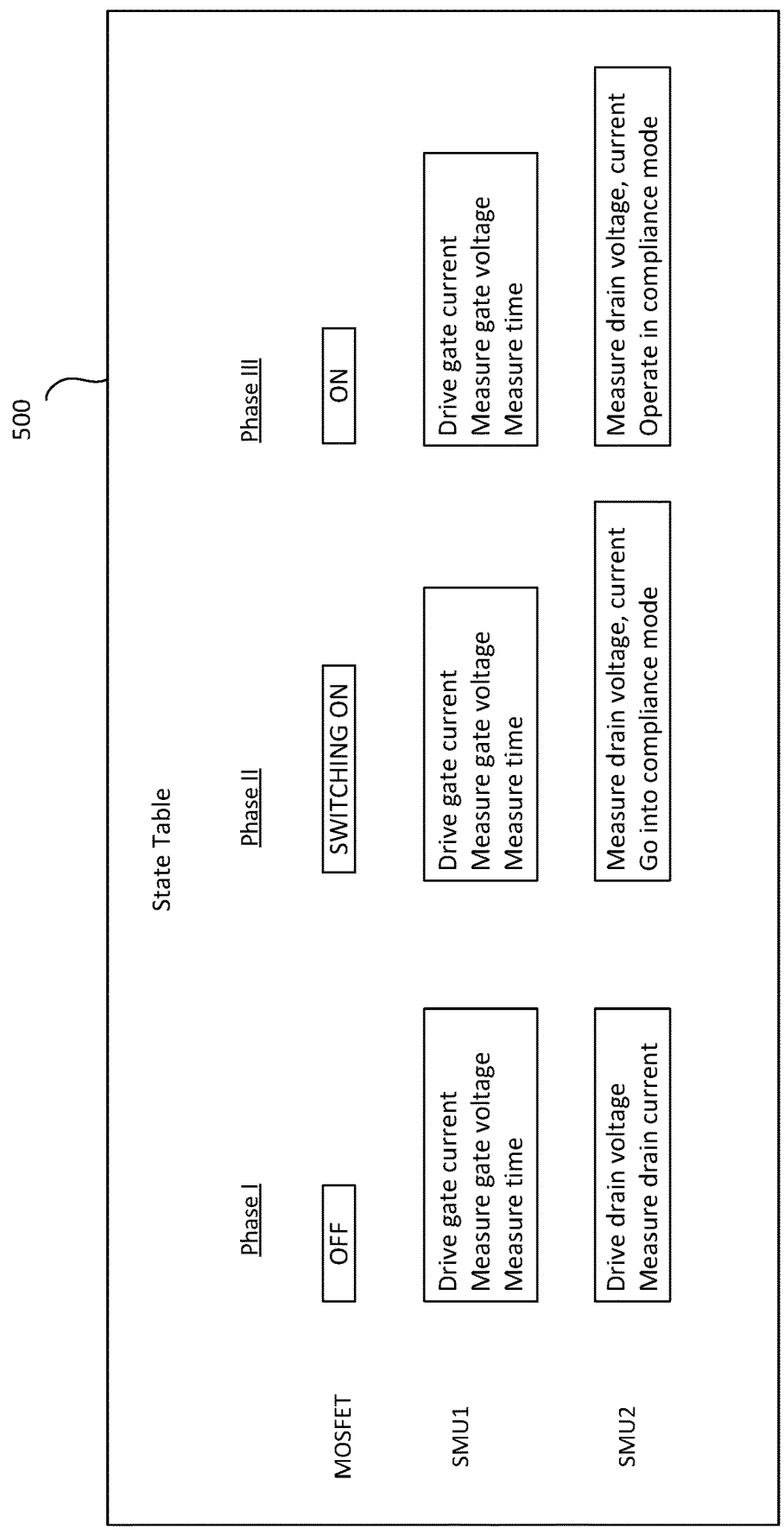
FIG. 5 is a state diagram illustrating various states of devices within the test and measurement system for measuring a gate charge of a power MOSFET according to embodiments of the disclosure.

FIG. 5 is a state diagram illustrating various states of devices within the test and measurement system 400 for measuring a gate charge of a power MOSFET according to embodiments of the disclosure. The state table 500 is broken into three phases, Phase I, Phase II, and Phase III, which correspond to the states previously described with reference to FIGS. 1 and 2. In Phase I, the MOSFET device 430 is in the OFF state, while the SMU1 410 is driving gate current and measuring gate voltage of the MOSFET 430 and time. Also during Phase I, the SMU2 420 is driving the drain voltage of the MOSFET 430 while measuring drain current. During Phase II, the MOSFET device 430 is switching ON, as determined by SMU2 420 detecting the sudden rise in drain current, as illustrated in FIG. 2. When the SMU2 420 determines the MOSFET device 430 turns ON, the SMU2 420, operating in compliance, automatically switches from driving the drain of the MOSFET 430 with a constant voltage to driving the drain of the MOSFET 430 with a constant current, while monitoring the voltage of the drain. During Phase II, as illustrated in FIG. 2, the drain voltage falls as the MOSFET 430 turns ON. Finally, during Phase III the SMU1 410 and SMU2 420 remain in the same states as during Phase II, while the MOSFET 430 is fully turned on and the gate voltage increases to its maximum voltage ($V_{gs}$Max).

Figure 6:
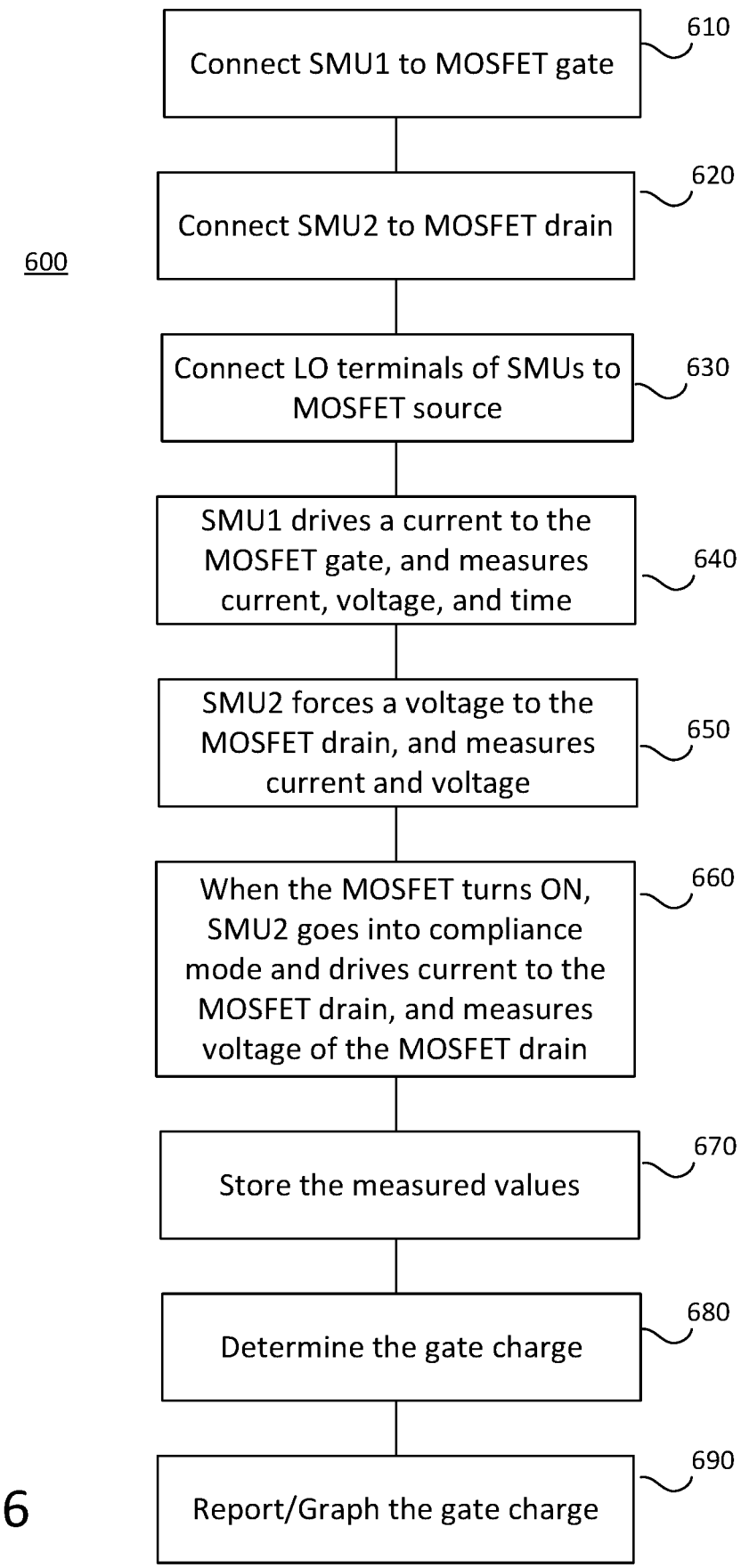
FIG. 6 is an example flow diagram illustrating operations used by embodiments of the disclosure for measuring various parameters of devices according to embodiments of the disclosure.

FIG. 6 is an example flow diagram 600 illustrating operations used by embodiments of the disclosure for measuring gate charge. In a first operation 610, the SMU1 410 is connected to the gate of the MOSFET device to be tested and the input parameters for the SMU1 are entered by a user. In a second operation 620, the SMU2 420 is connected to the drain of the same MOSFET device and the input parameters for the SMU2 are entered by a user. The LO terminals of both SMUs are connected to the MOSFET source in an operation 630.

In an operation 640, the SMU1 410 drives a current into the MOSFET gate as well as measures the gate current, voltage, and time. In operation 650, the SMU2 420 forces a voltage to the MOSFET drain and measures the drain current and voltage. As described above, the particular voltages and currents sourced by or measured by the SMUs 410, 420 are tied to accurate timings kept internally by the SMUs.

In an operation 660, the SMU2 420 detects that the MOSFET has turned ON, and switches to a current compliance mode, while measuring the falling voltage of the drain.

An operation 670 stores and displays the measured values. After the test is complete, the gate charge is calculated in an operation 680, and the results of the testing may be output to the user in an operation 690. The output may be in graphical form, although the output may also be stored as a data file.

Figure 7:
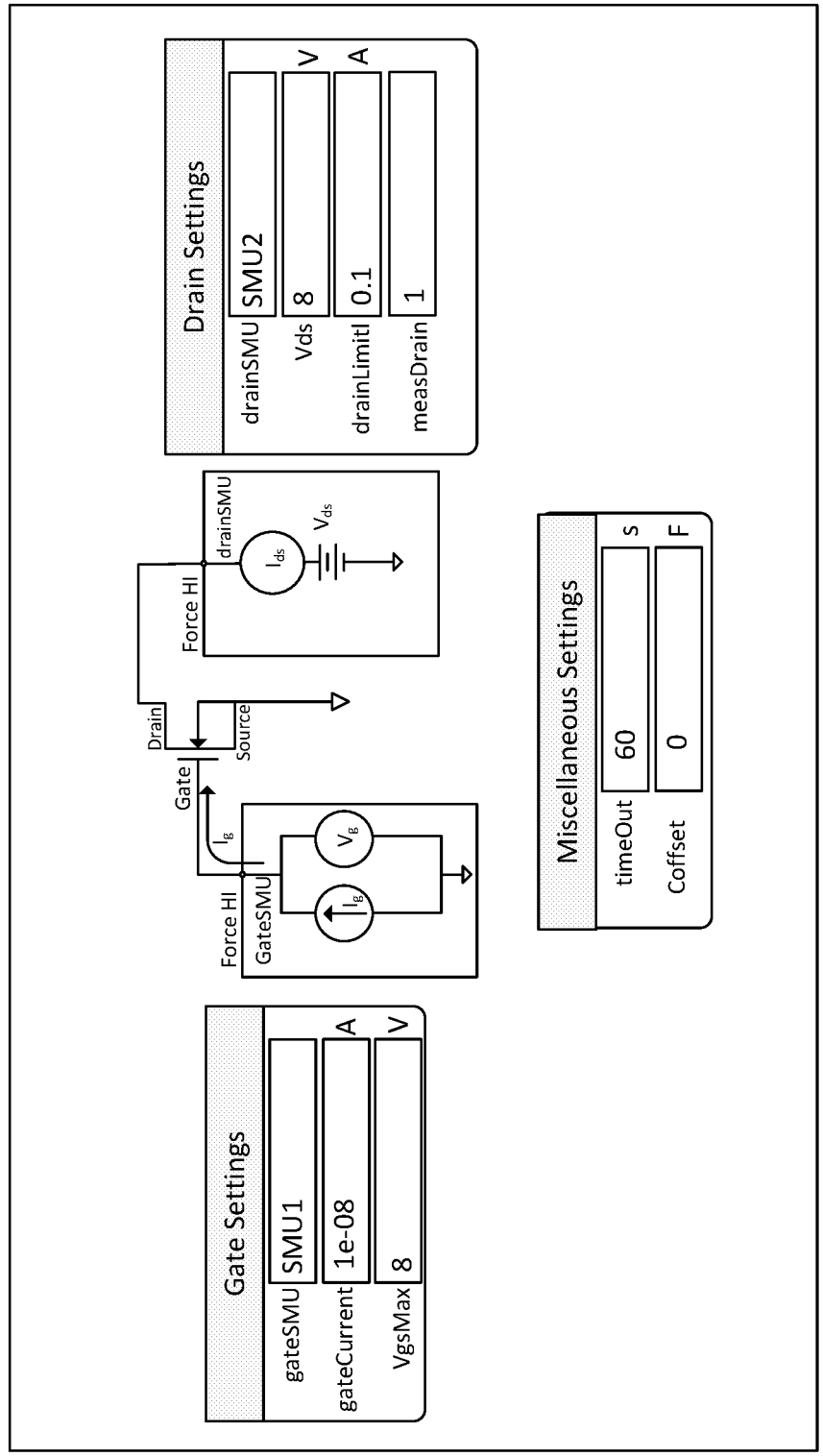
FIG. 7 is an example of a user interface on a display according to embodiments of the disclosure.

Before test execution, input test parameters are entered in a user interface, an example of which is shown in FIG. 7. The input parameters will vary depending on the device and which model of SMU is used. Descriptions of the example input parameters that may be used are listed in Table 1.

TABLE 1

Example Input parameters

| Input Parameter | Range of Values | Default Values | Description |
| --- | --- | --- | --- |
| gateSMU | SMU1-SMU8 | SMU1 | The SMU number connected to the gate terminal |
| drainSMU | SMU1-SMU8 | SMU2 | The SMU number connected to the drain terminal |
| source | GNDU | GNDU | The source terminal is typically connected to a Force LO terminal on GNDU |
| Vds | ±200 V | 10 V | The magnitude of the drain bias voltage of the drain SMU |
| drainLimitI | 4200-SMU: 0.1 A 4210-SMU: 1 A | 0.1 A | Current compliance of the drain SMU |
| gateCurrent | ±1E−5 A | 1e−7 A | The magnitude of the gate current of the gate SMU |
| VgsMax | ±200 V | 10 V | The maximum voltage level of the gate SMU. |
| timeOut | 0 to 300 s | 60 s | The number of seconds prior to a time out. |
| measDrain | 1 (yes) or 0 (no) | 1 | Return measured drain current |
| Coffset | 0 or Ceff | 0 | Run test with open circuit and then enter Ceff value returned to the user interface |

First, the SMU numbers (1-8) that are connected to the gate (gateSMU) and drain (drainSMU) of the MOSFET must be specified. The source terminal is connected to the GNDU, or Force LO. The magnitude of the current forced to the gate by the gateSMU, is the gateCurrent (Ig) parameter. The drain voltage (Vds) is the bias voltage applied to the drain and drainLimitI is the compliance current of the drain SMU.

A Coffset parameter (offset capacitance) is used by the testing system to correct for an offset capacitance, which may negatively affect the measurement results. Depending on the cabling and connections of the measurement system an offset capacitance may be present in the testing system. The offset capacitance is typically in the range of single picofarads to hundreds of picofarads. In some embodiments, these offset capacitances can be corrected by the testing system.

Embodiments of the invention may accurately measure the offset capacitance by first executing the gate charge test with an open circuit, which measures the offset capacitance. Then, the measured offset capacitance can be entered into the test system during setup, as described below.

To measure the offset capacitance, the user sets up the SMU test parameters with an open circuit as described above, setting the parameters as though the device were connected to the SMUs. However, the VgsMax is usually set higher for the offset measurement than for the actual test. For example, during the actual charge gate test, the VgsMax may be set to 5V, while for the test to measure offset capacitance, the VgsMax may be set to 50V. Once the parameters are set, then the gate charge test is executed with this open circuit.

After the test is executed with the open circuit, the measured offset capacitance of the system is calculated by software running on two SMUs and the measured offset capacitance is output to the user interface as Ceff. The software derives Ceff from the maximum gate voltage, gate current, and time. Because an open circuit is measured during this step, a Test Status Value of −9 or −12 may appear in the test status field, as discussed in further detail below, after the test is executed. This is because no device was actually measured during the offset capacitance test so there is no plateau region. However, the Ceff value is correct and can be entered as the Coffset in the settings, as illustrated in FIG. 7.

Next the gate charge test may be run on the device, as described above, using the Coffset parameter calculated during the offset capacitance test. Note that it is not strictly necessary that the offset capacitance be known before running the gate charge test, although more accurate results will be generated when the offset capacitance is used. After the charge test is completed, several parameters are returned from software. Table 2 lists descriptions of various parameters that are returned.

TABLE 2

Example Output parameters

| Output Parameter | Description |
| --- | --- |
| gate_charge | Test status values - see Table 3 for descriptions |
| timeArray | Measured time (seconds) |
| VgArray | Measured gate-source voltage (volts) |
| VgCharge | Measured gate charge (coulombs) |
| VdArray | Measured drain voltage (volts) |
| IdArray | Measured drain current (amps) |

TABLE 2-continued

Example Output parameters

| Output Parameter | Description |
| --- | --- |
| Slope | Dynamic slope (dVg/dt) of gate voltage |
| Ceff | Ratio of gate charge to maximum gate voltage |
| Vpl | Plateau or Miller voltage (volts) |
| T1 | Timestamp where the plateau area begins (seconds) |
| T2 | Timestamp where the plateau area ends (seconds) |
| Qgs | Gate charge from the origin to the first inflection point, or the voltage plateau (coulombs) |
| Qgd | Gate charge between the two inflection points in the gate charge curve (coulombs) |
| Qg | Gate charge from the origin to VgsMax (coulombs) |

Figure 8:
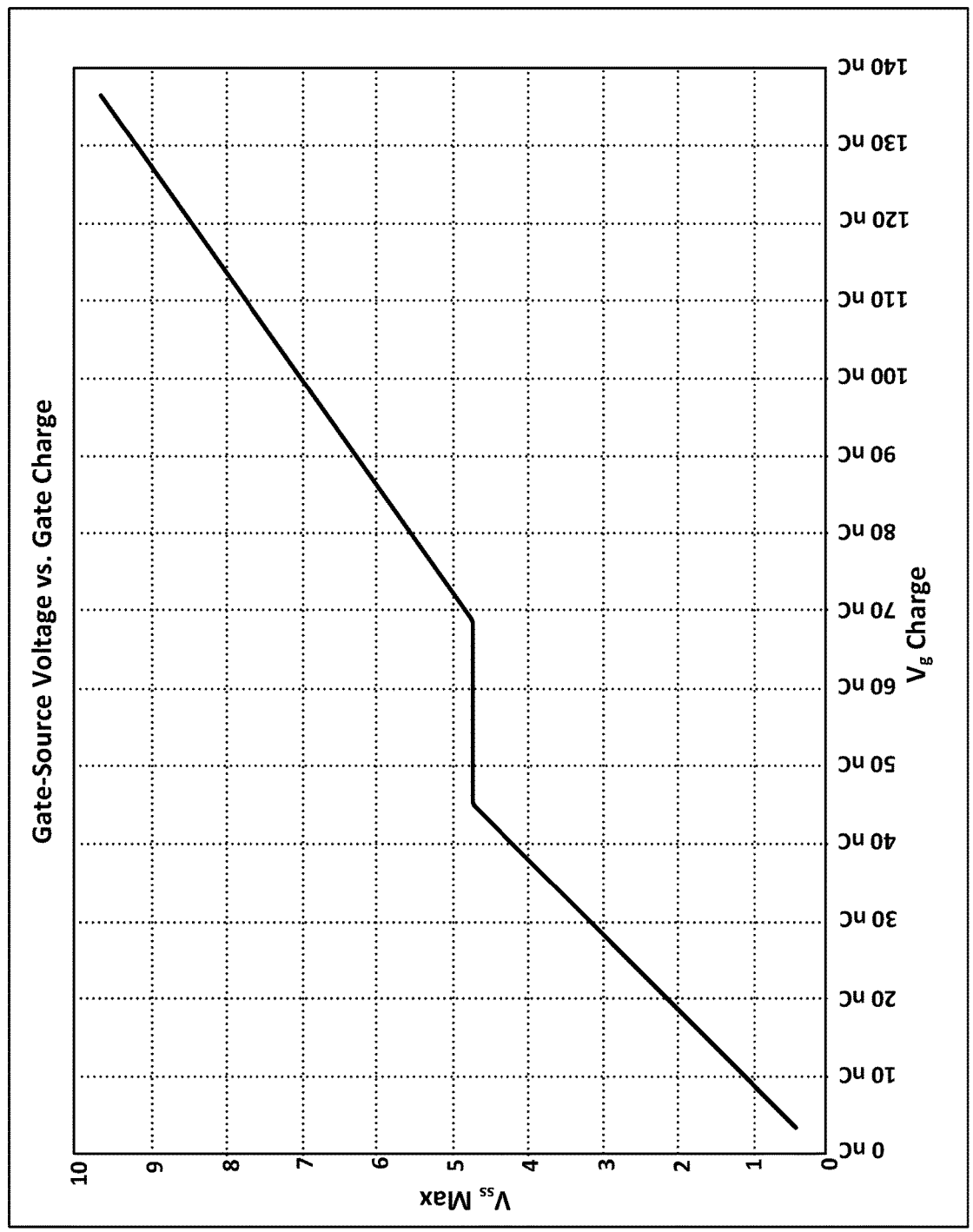
FIG. 8 is graph illustrating an example gate voltage waveform that may be generated by the test and measurement system according to embodiments of the disclosure.

The resulting gate-source voltage measured by the test can be plotted as a function of the gate charge. The measured parameters can be plotted as a function of time. FIG. 8 illustrates a typical gate voltage waveform that may be generated from the values measured during the gate charge test.

Figure 9:
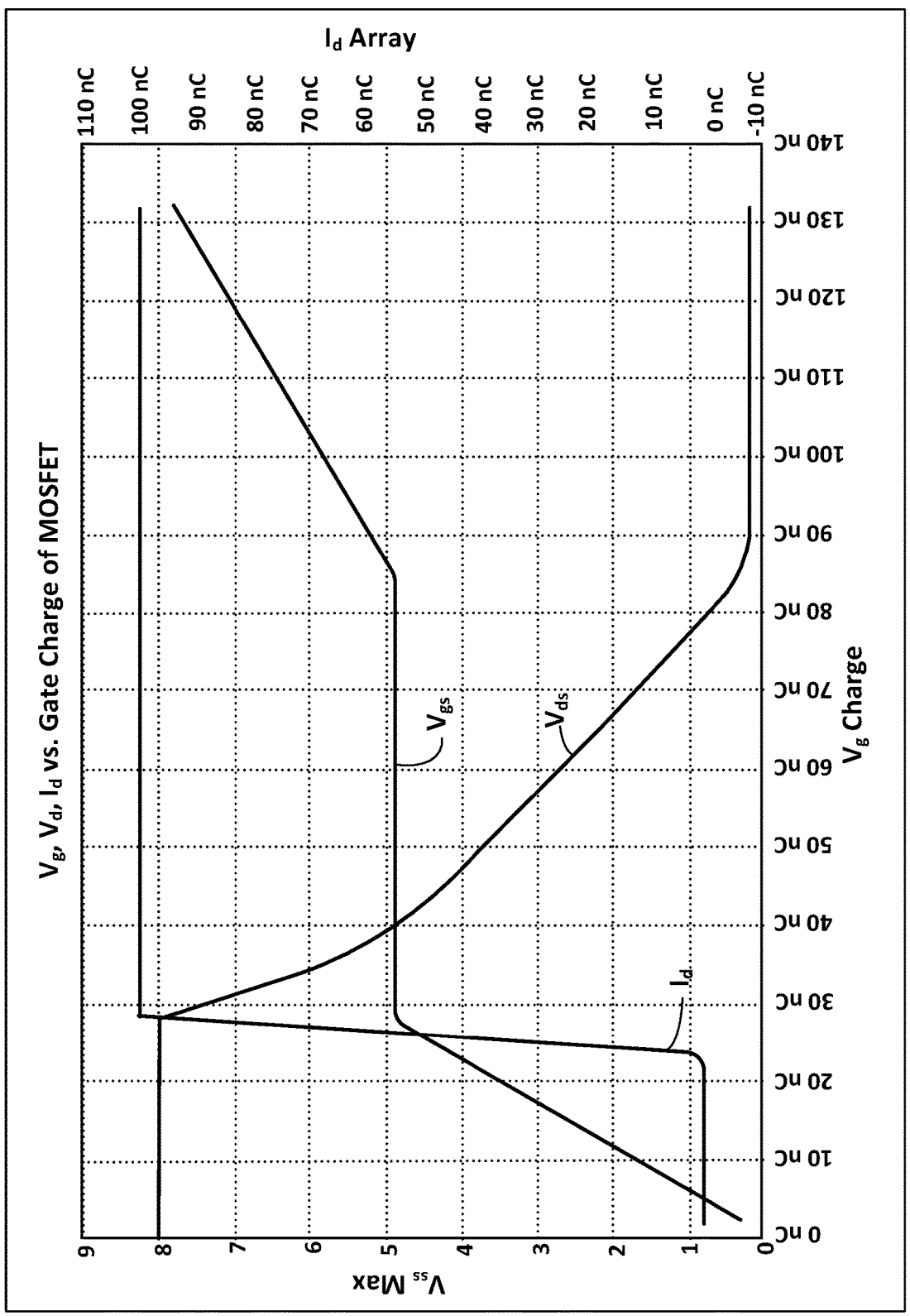
FIG. 9 is a graph illustrating an example gate-source voltage, drain voltage, and drain current vs. time waveforms displayed by a user interface of the test and measurement system according to some embodiments of the disclosure.

In addition to plotting Vgs, the measured values for Vds, and Id can also be plotted as a function of the gate charge or time. FIG. 9 illustrates an example output on a user interface showing all three parameters plotted as a function of the gate charge. In this example plot, the voltage is shown on the Y1 axis and the current is plotted on the Y2 axis.

Each time the test is executed, a Test Status Value is returned to the user interface. Table 3 shows the possible test status values of the test outcome, as well as and their corresponding descriptions and notes.

TABLE 3

Example Test Status Values

| Test Status | Description | Notes |
| --- | --- | --- |
| 1 | No errors | Test successful. |
| −1 | Gate SMU is not present | Specify correct SMU. |
| −2 | Drain SMU is not present | Specify correct SMU. |
| −3 | VgsMax > 200 V | Verifies gate voltage is less than 200 V. Reduce gate voltage. |
| −4 | Drain current limit exceeds limit Drain current limits exceeds limit | Verifies drain current is less than limit. Reduce drain current limit (drainLimitI). |
| −5 | Power limit exceeded | Current should be <0.1 A if V > 20 V. Decrease drain current limit (drainLimitI) or drain voltage (Vds). |
| −6 | Error check on input conditions. Limits timeOut to 200 s. | Specify timeOut to <200 s. |
| −7 | Test time exceeds specified time out (timeOut). | Increase timeOut. Maximum is 200 s. Try increasing gateCurrent to charge up device faster. |
| −8 | Number of iterations/measurements >10000. | Increase gate current (gateCurrent). |
| −9 | Number of iterations/measurements <5 | Decrease gate current (gateCurrent). Check device, test set-up and for correct SMU. This error can be ignored if it occurs while measuring an open circuit for offset correction. The Ceff value is still valid. |
| −10 | Number of points from origin to first plateau point is <10 | Decrease gate current (gateCurrent) |
| −11 | Error calculating slope, S1. Correlation factor < 0.9. Curve from origin to first plateau point is not linear. | Check device and test set-up. |
| −12 | Error calculating slope, S2. Correlation factor < 0.9. Curve from last plateau point to VgsMax is not linear. | Check device and test set-up. If VgCharge or VdArray appear high, try reducing gateCurrent and repeat test. |

TABLE 3-continued

Example Test Status Values

| Test Status | Description | Notes |
|---|---|---|
| | | This error can be ignored if it occurs while measuring an open circuit for offset correction. The Ceff value is still valid. |
| −13 | Vds > 200 V | Decrease drain voltage. |
| −14 | gateCurrent > 10 μA | Decrease gate current (Ig). |

As will be understood by one skilled in the art, the various input, output and test status parameters may vary depending on the test and measurement system used, as well as required by the particular test set-up. Table 1, Table 2, and Table 3 list the parameters and status that may be received and/or output from the test and measurement system.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media. Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described regarding a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 a testing system for testing one or more values of a MOSFET device including a first source measure unit connected to a gate of the MOSFET device and programmed to drive a pre-determined electrical current to the gate of the MOSFET device; and a second source measure unit connected to a drain of the MOSFET device, the second source measure unit configured to drive a pre-determined electrical voltage to the drain of the MOSFET device, measure a current of the drain of the MOSFET device, detect if the drain current exceeds a compliance current, and measure drain voltage of the MOSFET device over time.

Example 2 is the testing system according to example 1, in which one of the source measure units derives and stores data including MOSFET gate charge over a time period and MOSFET gate voltage over the same time period.

Example 3 is the testing system according to either one of examples 1 and 2, in which one of the source measure units measures and outputs the gate voltage over the time period, and derives a gate charge of the MOSFET over the time period.

Example 4 is the testing system according to any one of examples 1-3, in which one of the source measure units outputs the gate charge over the time period and MOSFET gate voltage over the time period to a user.

Example 5 is the testing system according to any one of examples 1-4, in which one of the source measure units outputs the gate charge over the time period and MOSFET gate voltage over the time period in a user interface.

Example 6 is the testing system according to any one of examples 1-5, in which of the source measure units outputs the gate charge over the time period and MOSFET gate voltage over the time period in a data file.

Example 7 is the testing system according to any one of examples 1-6, in which one of the source measure units is structured to automatically switch modes of operation when the drain current exceeds the compliance current without user intervention.

Example 8 is a method in a testing environment in which a first source/measuring unit is connected to a gate of a MOSFET device and in which a second source/measuring unit is connected to a drain of the MOSFET device, comprising: driving a pre-determined electrical current to the gate of the MOSFET device; driving a pre-determined electrical voltage to the drain of the MOSFET device, measuring a current of the drain of the MOSFET device, based on the measured drain current, determine whether the measured drain current is at a compliance limit; and measuring a voltage of the drain of the MOSFET device over time.

Example 9 is the method of example 8, further comprising storing data including MOSFET gate charge over a time period and MOSFET gate voltage over the same time period.

Example 10 is the method of one of examples 8 or 9, further comprising deriving a gate charge of the MOSFET from the gate charge over the time period and the gate voltage over the time period.

Example 11 is the method of example 10, further comprising outputting the gate charge over the time period and MOSFET gate voltage over the time period to a user.

Example 12 is the method of example 11, in which outputting the gate charge over the time period comprises displaying gate charge data and gate voltage data on a user interface, or providing gate charge data and gate voltage data in a data file.

Example 13 is the method of any one of examples 8-12, further comprising, in response to the current level reaching the compliance limit, automatically switching modes of operation without user intervention.

Example 14 is one or more computer-readable storage media comprising instructions, which, when executed by one or more processors of a testing environment in which a first measuring unit is connected to a gate of a MOSFET device and in which a second measuring unit is connected to a drain of the MOSFET device, cause at least one of the first measuring unit and second measuring unit to: drive a pre-determined electrical current to the gate of the MOSFET device; drive a pre-determined electrical voltage to the drain of the MOSFET device, measure a current of the drain of the MOSFET device, based on the measured drain current, determine whether the drain current has reached a compliance current; and measure a voltage of the drain of the MOSFET device over time.

Example 15 is the one or more computer-readable storage media according to example 14, further comprising instructions configured to cause the at least one of the first measuring unit and second measuring unit to store data including MOSFET gate charge over a time period and MOSFET gate voltage over the same time period.

Example 16 is the one or more computer-readable storage media according to one of example 14 and 15, further comprising instructions configured to cause the at least one of the first measuring unit and second measuring unit to derive a gate charge of the MOSFET from the gate charge over the time period and the gate voltage over the time period.

Example 17 is the one or more computer-readable storage media according to one of the examples 14-16, further comprising instructions configured to cause the at least one of the first measuring unit and second measuring unit to output the gate charge over the time period and MOSFET gate voltage over the time period to a user.

Example 18 is the one or more computer-readable storage media according to one of the examples 14-17, in which outputting the gate charge over the time period comprises displaying gate charge data and gate voltage data on a user interface.

Example 19 is the one or more computer-readable storage media according to one of the examples 14-18, further comprising instructions configured to cause the at least one of the first measuring unit and second measuring unit to, in response to the drain current level reaching the compliance limit, automatically switch modes of operation without user intervention.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A testing system for testing one or more values of a MOSFET device, the testing system comprising:
   a first source measure unit connected to a gate of the MOSFET device and programmed to drive a pre-determined electrical current to the gate of the MOSFET device; and
   a second source measure unit connected to a drain of the MOSFET device, the second source measure unit configured to:
   drive a pre-determined electrical voltage to the drain of the MOSFET device,
   measure a current of the drain of the MOSFET device,
   detect if the drain current exceeds a compliance current, and
   measure drain voltage of the MOSFET device over time.

2. The testing system according to claim 1, in which one of the source measure units derives and stores data including MOSFET gate charge over a time period and MOSFET gate voltage over the same time period.

3. The testing system according to claim 2, in which one of the source measure units measures and outputs the gate voltage over the time period, and derives a gate charge of the MOSFET over the time period.

4. The testing system according to claim 2, in which one of the source measure units outputs the gate charge over the time period and MOSFET gate voltage over the time period to a user.

5. The testing system according to claim 4, in which one of the source measure units outputs the gate charge over the time period and MOSFET gate voltage over the time period in a user interface.

6. The testing system according to claim 4, in which one of the source measure units outputs the gate charge over the time period and MOSFET gate voltage over the time period in a data file.

7. The testing system according to claim 4, in which one of the source measure units is structured to automatically switch modes of operation when the drain current exceeds the compliance current without user intervention.

8. A method in a testing environment in which a first source/measuring unit is connected to a gate of a MOSFET device and in which a second source/measuring unit is connected to a drain of the MOSFET device, comprising:
    driving a pre-determined electrical current to the gate of the MOSFET device;
    driving a pre-determined electrical voltage to the drain of the MOSFET device,
    measuring a current of the drain of the MOSFET device,
    based on the measured drain current, determine whether the measured drain current is at a compliance limit; and
    measuring a voltage of the drain of the MOSFET device over time.

9. The method according to claim 8, further comprising storing data including MOSFET gate charge over a time period and MOSFET gate voltage over the same time period.

10. The method according to claim 9, further comprising deriving a gate charge of the MOSFET from the gate charge over the time period and the gate voltage over the time period.

11. The method according to claim 9, further comprising outputting the gate charge over the time period and MOSFET gate voltage over the time period to a user.

12. The method according to claim 11, in which outputting the gate charge over the time period comprises displaying gate charge data and gate voltage data on a user interface, or providing gate charge data and gate voltage data in a data file.

13. The method according to claim 8, further comprising, in response to the current level reaching the compliance limit, automatically switching modes of operation without user intervention.

14. One or more computer-readable storage media comprising instructions, which, when executed by one or more processors of a testing environment in which a first measuring unit is connected to a gate of a MOSFET device and in which a second measuring unit is connected to a drain of the MOSFET device, cause at least one of the first measuring unit and second measuring unit to:
    drive a pre-determined electrical current to the gate of the MOSFET device;
    drive a pre-determined electrical voltage to the drain of the MOSFET device,
    measure a current of the drain of the MOSFET device,
    based on the measured drain current, determine whether the drain current has reached a compliance current; and
    measure a voltage of the drain of the MOSFET device over time.

15. The one or more computer-readable storage media according to claim 14, further comprising instructions configured to cause the at least one of the first measuring unit and second measuring unit to store data including MOSFET gate charge over a time period and MOSFET gate voltage over the same time period.

16. The one or more computer-readable storage media according to claim 14, further comprising instructions configured to cause the at least one of the first measuring unit and second measuring unit to derive a gate charge of the MOSFET from the gate charge over the time period and the gate voltage over the time period.

17. The one or more computer-readable storage media according to claim 14, further comprising instructions configured to cause the at least one of the first measuring unit and second measuring unit to output the gate charge over the time period and MOSFET gate voltage over the time period to a user.

18. The one or more computer-readable storage media according to claim 17, in which outputting the gate charge over the time period comprises displaying gate charge data and gate voltage data on a user interface.

19. The one or more computer-readable storage media according to claim 14, further comprising instructions configured to cause the at least one of the first measuring unit and second measuring unit to, in response to the drain current level reaching the compliance limit, automatically switch modes of operation without user intervention.

* * * * *